US007010775B2

(12) United States Patent
Ohmori

(10) Patent No.: US 7,010,775 B2
(45) Date of Patent: Mar. 7, 2006

(54) METHOD FOR CREATING MASK PATTERN FOR CIRCUIT FABRICATION AND METHOD FOR VERIFYING MASK PATTERN FOR CIRCUIT FABRICATION

(75) Inventor: Kiyoshige Ohmori, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 78 days.

(21) Appl. No.: 10/622,566

(22) Filed: Jul. 21, 2003

(65) Prior Publication Data

US 2004/0019870 A1 Jan. 29, 2004

(30) Foreign Application Priority Data

Jul. 22, 2002 (JP) ............................ 2002-212945

(51) Int. Cl.
*G06F 17/50* (2006.01)

(52) U.S. Cl. .......................................... 716/19; 719/21

(58) Field of Classification Search ................ 716/4–5, 716/19–21; 430/5, 30
See application file for complete search history.

(56) References Cited

U.S. PATENT DOCUMENTS 5,879,844 A * 3/1999 Yamamoto et al. ........... 430/30
6,057,063 A * 5/2000 Liebmann et al. ............. 430/5
6,077,310 A * 6/2000 Yamamoto et al. ........... 716/19
2003/0163791 A1* 8/2003 Falbo et al. .................. 716/2

FOREIGN PATENT DOCUMENTS

JP 11-174659 7/1999

* cited by examiner

*Primary Examiner*—Vuthe Siek
(74) *Attorney, Agent, or Firm*—Nixon & Vanderhye P.C.

(57) ABSTRACT

A method for creating mask pattern data for fabricating a circuit includes the steps of dividing original mask pattern data into a plurality of regions having a first size; performing OPC on the plurality of regions and creating first mask pattern data based on the plurality of processed regions; dividing the original mask pattern data into a plurality of regions having a second size; performing OPC on the plurality of regions and creating second mask pattern data based on the plurality of processed regions; and when no non-matching data is present as a result of matching comparison, setting the first or second mask pattern data as the mask pattern data for fabricating the circuit; and when non-matching data is present as a result of the comparison, deleting the non-matching data from the first or second mask pattern data so as to create the mask pattern data for fabricating the circuit.

18 Claims, 10 Drawing Sheets

METHOD FOR CREATING MASK PATTERN FOR CIRCUIT FABRICATION AND METHOD FOR VERIFYING MASK PATTERN FOR CIRCUIT FABRICATION

BACKGROUND OF THE INVENTION

1. Field of the Invention

The present invention generally relates to a method for creating mask pattern data for fabricating a circuit for correcting an original mask pattern by optical proximity correction to create corrected mask pattern data, and a method for verifying a mask pattern for fabricating a circuit for verifying that the corrected mask pattern data has been properly corrected. Specifically, the present invention relates to such a method for creation and such a method for verification used for transferring a layout pattern of a large scale integrated circuit with high fidelity by exposing a corrected mask on a wafer.

2. Description of the Related Art

Recently, large scale integrated circuits (LSIs) are increasingly miniaturized, and the layout patterns of the LSIs are increasingly miniaturized. This also requires the photomask patterns used in lithography in an LSI fabrication process to be miniaturized.

When a photomask pattern is extremely miniaturized, it may be difficult to control the size of the photomask pattern or the photomask pattern may be deformed.

One of the reasons for the above problems is optical proximity, which occurs when a pattern is made in a mask. When this occurs, the mask pattern is not reproduced with high fidelity. Another reason is pattern distortion, which occurs when the mask pattern is transferred onto a wafer. When this occurs, the mask pattern is not reproduced with high fidelity.

Conventionally, a light beam having a relatively short wavelength (about 365 nm) is used for exposure. Such a light beam is referred to as an "i beam". Use of the i beam allows an LSI circuit using a mask pattern having each side of about 0.5 $\mu$m to 0.3 $\mu$m to be fabricated with a precision of about 0.05 $\mu$m. Today, a KrF excimer laser beam having a shorter wavelength (about 248 nm) is used for exposure in a lithography step.

A mask having patterns at a high density is only transferred onto a wafer with a low level of reproducibility. Particularly, a mask having a pattern smaller than the wavelength of light involves the problems described below with reference to FIGS. 8 through 10.

FIG. 8 shows an example of a mask pattern to be exposed and a mask pattern transferred onto a wafer. Reference numeral 101 represents a rectangular mask pattern to be exposed (for example, a pattern for a conductive line), and reference numeral 102 represents a mask pattern transferred onto a wafer. The corners of the mask pattern 102 are rounded by optical proximity, resulting in having portions 103 missing. Consequently, the mask pattern 102 is shorter than the mask pattern 101. This causes electrical disadvantages (for example, a reduction in current capacitance).

FIG. 9 shows another example of a mask pattern to be exposed and a mask pattern transferred onto a wafer. Reference numeral 111 represents a square mask pattern to be exposed (for example, a pattern for a contact hole), and reference numeral 112 represents a mask pattern transferred onto a wafer. The corners of the mask pattern 112 are rounded by optical proximity, resulting in having portions 113 missing.

FIG. 10 shows still another example of a mask pattern to be exposed and a mask pattern transferred onto a wafer. Reference numeral 121 represents a plurality of square mask pattern elements to be exposed, and reference numeral 121' also represents a mask pattern element to be exposed. The mask pattern elements 121 are arranged regularly at a high density, and the mask pattern element 121' is located away from the plurality of square mask pattern elements 121. The mask pattern elements 121 and 121' each have sides having a length "a".

Reference numeral 122 represents a plurality of mask pattern elements transferred onto a wafer, and reference numeral 122' also represents a mask pattern element transferred onto the wafer. The corners of the mask pattern elements 122 and 122' are rounded by optical proximity, resulting in having portion elements 123 and 123' missing. In such an arrangement, the mask patterns 122 and 122' have different sizes. For example, each side of one mask pattern element 122 has a length "c", and each side of another mask pattern element 122 has a length "d". Each side of the mask pattern element 122' has a length This has adverse influences on the operating timings, production yield, and the like of LSI circuits.

The above-described problems caused by optical proximity occur even when light of a short wavelength is used for lithography, and can be solved by correcting, for example, the size or shape of the mask pattern. This is realized by predicting how the mask pattern will be deformed or distorted by optical proximity when transferred onto the wafer. Such a correction is referred to as "optical proximity correction (OPC)". A mask processed with OPC is referred to as an "OPC mask". Especially when miniaturized mask patterns having a design rule (minimum processing size) of 0.35 $\mu$m or less is required, OPC and OPC masks are widely used.

Such a correction of mask patterns is conventionally performed based on experience on the size or arrangement of the patterns. As the mask pattern design simulation technology is developed, the mask patterns are now corrected systematically as a part of the LSI circuit design system.

The pattern distortion caused by optical proximity (hereinafter, referred to as a "proximity distortion") is corrected by OPC as follows. Based on data empirically obtained by exposing test patterns for characteristic evaluation, the proximity distortion is mathematically described using OPC software. Specifically, the mathematic description of the proximity distortion is performed by a technique called "rule-based OPC". Such a mathematical description of the proximity distortion represents a rule indicating how the layout pattern of the mask is to be changed (correction rule). Based on the rule, a rule set for processing the mask pattern by OPC is created. The mask pattern is processed by OPC in accordance with the rule set.

Alternatively, the mathematical description of the proximity distortion may be performed by a technique called "model-based OPC". In this case, optical simulation is performed based on design data. According to this technique, the mathematical description of the proximity distortion represents a model indicating how the mask pattern is to be changed (correction model). Based on the model, a model set for processing the mask pattern by OPC is created. The mask pattern is processed by OPC in accordance with the model set. The "model-based OPC" considers optical distortion or process-related distortion predicted to occur when the pattern is transferred onto a wafer, and can cope with more complicated processes.

The OPC software including the rule set or the model set automatically performs correction processing (for example, change of mask patterns, movement of the edges of lines, addition of special patterns, etc.). The correction is performed on data representing a mask pattern which is predicted to be distorted when transferred onto a wafer (for example, the mask pattern 111 in FIG. 9). Thus, corrected mask pattern data is created.

A pattern obtained on a wafer through a mask pattern corrected by OPC reproduces a pattern represented by the design data at higher fidelity than a pattern obtained on a wafer through an uncorrected mask pattern.

The conventional OPC described above is time-consuming, since it is necessary to correct data representing a miniaturized mask pattern and create data representing a miniaturized corrected mask pattern.

FIG. 11 shows an example of a mask pattern corrected by OPC. Each corner of the square mask pattern (for example, a pattern for a contact hole) is provided with a small projection pattern 104. Owing to this, the degree of proximity distortion caused when the mask pattern is transferred onto a wafer is reduced. A pattern of a shape like the projection pattern 104 is referred to as a "serif pattern".

A square mask pattern as shown in FIG. 11 is corrected into a pattern including 9 quadrangular portions or having 20 corners. Such a correction which increases the number of quadrangular portions requires a long processing time.

FIG. 12 shows another example of a mask pattern corrected by OPC. Each end of the long rectangular mask pattern (for example, a pattern for a conductive line) is provided with a projection pattern 105. Owing to this, the degree of proximity distortion caused when the mask pattern is transferred onto a wafer is reduced. A pattern of a shape like the projection pattern 105 is referred to as a "hammer head".

A rectangular mask pattern as shown in FIG. 12 is corrected into a pattern including 7 rectangular portions or having 12 corners. Such a correction which increases the number of rectangular portions requires a long processing time.

FIG. 13 shows still another example of a mask pattern corrected by OPC. A projecting corner of the L-shaped mask pattern (for example, a pattern for a projecting corner of a conductive line) is provided with a projection pattern 106, and a recessed corner of the L-shaped mask pattern (for example, a pattern for a recessed corner of a conductive line) is provided with a recessed pattern 107. Owing to this, the degree of proximity distortion caused when the mask pattern is transferred onto a wafer is reduced. A pattern of a shape like the projection pattern 106 is referred to as an "out-corner serif pattern", and a pattern of a shape like the recessed pattern 107 is referred to as an "in-corner serif pattern". In this case also, the number of rectangular portions is increased, which requires a long processing time.

As described above with reference to FIGS. 11 through 13, a correction by OPC increases the number of quadrangular portions of a mask pattern as compared to that of the mask pattern represented by the design data. Thus, a long processing time is required.

When the OPC processing program has errors, corrected mask pattern data which should not be created may be created, or corrected mask pattern data which cannot be realized by the production process of the mask may be created.

Japanese Laid-Open Publication No. 11-174659, for example, discloses a verification method (resize check) for verifying that the corrected mask pattern has been properly corrected. This method will be described below.

Oversized mask pattern data and undersized mask pattern data are created. The oversized mask pattern data is created by oversizing the original mask pattern data by a maximum bias. The undersized mask pattern data is created by undersizing original mask pattern data by the maximum bias. The maximum bias is a maximum width by which an edge portion of the line can be corrected by OPC.

The corrected mask pattern data is compared with the oversized mask pattern data and the undersized mask pattern data. When the corrected width of the corrected mask pattern does not exceed the maximum bias, it is determined that "the corrected mask pattern has been properly corrected".

FIG. 14 shows a procedure of the corrected mask pattern verification method disclosed in Japanese Laid-Open Publication No. 11-174659. The method will be described with reference to FIG. 14.

Step S101: A simple rule is extracted based on empirical data obtained from a result of exposure of a test pattern for characteristic evaluation. The rule is extracted for the purpose of changing the mask pattern. After the rule is extracted, the processing goes to step S102.

Step S102: The optimum correction amount for OPC (maximum bias) is obtained. Then, the processing goes to step S103.

Step S103: A rule file is created based on the extracted rule (step S101) and the optimum correction amount (step S102). Then, the processing goes to step S105.

Step S104: Original mask pattern data which is design data of the mask pattern is created. Then, the processing goes to step S105.

Step S105: An OPC rule set is created based on the rule file (step S103) and the original mask pattern data (step S104). Then, the processing goes to steps S106 and S107.

Step S106: The original mask pattern is oversized by the maximum bias so as to create oversized mask pattern data. The original mask pattern is also undersized by the maximum bias so as to create undersized mask pattern data. Then, the processing goes to step S110.

Step S107: The original mask pattern is divided into a plurality of regions (template size processing). This is performed for the purpose of alleviating the load of the OPC processing. Then, the processing goes to step S108.

Step S108: The plurality of divided regions (templates) are each processed by OPC in accordance with the OPC rule set (step S105). Then, the processing goes to step S109.

Step S109: Corrected mask pattern data is created. Then, the processing goes to step S110.

Step S110: The corrected mask pattern data (step S109), and the oversized mask pattern data and undersized mask pattern data created in step S106, are subjected to subtraction by graphic operation processing, such that data representing the common graphic pattern is deleted, thus comparing the two types of data. Then, the processing goes to step S111.

Step S111: Based on the comparison result, comparison data is created. Then, the processing goes to step S112.

Step S112: A resize check is performed to determine whether or not the created comparison data includes data exceeding the maximum bias. When data exceeding the maximum bias is present, the processing goes to step S113. When data exceeding the maximum bias is not present, it is determined that the corrected mask pattern data has been properly corrected. Thus, the processing goes to step S114.

Step S113: The data exceeding the maximum bias is corrected, so as to create properly corrected mask pattern data. Then, the processing goes to step S114.

Step S114: The properly corrected mask pattern data is output as mask data. Then, the processing goes to step S115.

Step S115: A mask is produced based on the mask data (step S114).

The above-described conventional verification method has the following problems. Unless both of the difference between the original mask pattern and the oversized mask pattern, and the difference between the original mask pattern and the undersized mask pattern, exceed the maximum bias, it cannot be accurately checked whether or not the corrected mask pattern has been properly corrected in accordance with the correction rule or correction model.

In addition, with the conventional verification method, it is required to use different methods for different types of corrected mask pattern data. For example, only one type of rule-based OPC mask pattern data is created, whereas a plurality of types of model-based OPC mask pattern data may be created. An appropriate verification method needs to be used for each of the rule-based OPC mask pattern data and the model-based OPC mask pattern data.

SUMMARY OF THE INVENTION

According to one aspect of the invention, a method for creating mask pattern data for fabricating a circuit includes a first step of dividing original mask pattern data into a first plurality of regions each having a first size; a second step of performing optical proximity correction on each of the first plurality of regions obtained in the first step and creating first mask pattern data based on each of the first plurality of regions processed by the optical proximity correction; a third step of dividing the original mask pattern data into a second plurality of regions each having a second size which is different from the first size; a fourth step of performing optical proximity correction on each of the second plurality of regions obtained in the third step and creating second mask pattern data based on each of the second plurality of regions processed by the optical proximity correction; a fifth step of comparing the first mask pattern data and the second mask pattern data; and a sixth step of, when it is determined that there is no non-matching data representing a non-matching portion between the first mask pattern data and the second mask pattern data as a result of the comparison performed in the fifth step, setting the first mask pattern data or the second mask pattern data as the mask pattern data for fabricating the circuit; and when it is determined that there is non-matching data, deleting the non-matching data from the first mask pattern data or the second mask pattern data so as to create the mask pattern data for fabricating the circuit.

In one embodiment of the invention, at least one of the first size and the second size is determined based on an experimentally obtained correlation between the optical proximity correction processing time and the size of the plurality of divided regions, and is a value at which the optical proximity correction processing time is minimum or a value close thereto.

In one embodiment of the invention, the second step includes the step of grouping the first plurality of regions obtained in the first step and performing optical proximity correction of the groups in parallel. The fourth step includes the step of grouping the second plurality of regions obtained in the third step and performing optical proximity correction of the groups in parallel.

According to another aspect of the invention, a method for creating mask pattern data for fabricating a circuit includes a first step of dividing original mask pattern data into a first plurality of regions each having a first size; a second step of performing optical proximity correction on each of the first plurality of regions obtained in the first step and creating first mask pattern data based on each of the first plurality of regions processed by the optical proximity correction; a third step of dividing the original mask pattern data into a second plurality of regions each having a second size which is different from the first size; a fourth step of performing optical proximity correction on each of the second plurality of regions obtained in the third step and creating second mask pattern data based on each of the second plurality of regions processed by the optical proximity correction; a fifth step of comparing the first mask pattern data and the second mask pattern data and creating comparison result data; and a sixth step of determining whether or not a graphic pattern included in the comparison result data created in the fifth step has a size within a prescribed range; and a seventh step of, when it is determined that the graphic pattern has a size within the prescribed range as a result of the comparison performed in the sixth step, setting the first mask pattern data or the second mask pattern data as the mask pattern data for fabricating the circuit; and when it is determined that the graphic pattern has a size outside the prescribed range as a result of the comparison performed in the sixth step, deleting a portion of the graphic pattern which is outside the prescribed range from the first mask pattern data or the second mask pattern data so as to create the mask pattern data for fabricating the circuit.

In one embodiment of the invention, the prescribed range is Grid$\times\sqrt{2}$ or more but Grid$\times$2 or less, where Grid is a size defining the minimum unit of the pattern.

In one embodiment of the invention, at least one of the first size and the second size is determined based on an experimentally obtained correlation between the optical proximity correction processing time and the size of the plurality of divided regions, and is a value at which the optical proximity correction processing time is minimum or a value close thereto.

In one embodiment of the invention, the second step includes the step of grouping the first plurality of regions obtained in the first step and performing optical proximity correction of the groups in parallel. The fourth step includes the step of grouping the second plurality of regions obtained in the third step and performing optical proximity correction of the groups in parallel.

According to still another aspect of the invention, a method for verifying mask pattern data for fabricating a circuit includes a first step of dividing original mask pattern data into a first plurality of regions each having a first size; a second step of performing optical proximity correction on each of the first plurality of regions obtained in the first step and creating corrected mask pattern data based on each of the first plurality of regions processed by the optical proximity correction; a third step of dividing the original mask pattern data into a second plurality of regions each having a second size which is different from the first size; a fourth step of performing optical proximity correction on each of the second plurality of regions obtained in the third step and creating mask pattern data for verification based on each of the second plurality of regions processed by the optical proximity correction; a fifth step of comparing the corrected mask pattern data and the mask pattern data for verification; and a sixth step of, when it is determined that there is no non-matching data representing a non-matching portion between the corrected mask pattern data and the mask pattern data for verification as a result of the comparison performed in the fifth step, determining that the corrected mask pattern data has been properly corrected and setting the corrected mask pattern data as the mask pattern data for fabricating the circuit; and when it is determined that there is non-matching data, determining that the corrected mask pattern data has not been properly corrected and deleting the non-matching data from the corrected mask pattern data so as to create the mask pattern data for fabricating the circuit.

In one embodiment of the invention, at least one of the first size and the second size is determined based on an experimentally obtained correlation between the optical proximity correction processing time and the size of the plurality of divided regions, and is a value at which the optical proximity correction processing time is minimum or a value close thereto.

In one embodiment of the invention, the second step includes the step of grouping the first plurality of regions obtained in the first step and performing optical proximity correction of the groups in parallel. The fourth step includes the step of grouping the second plurality of regions obtained in the third step and performing optical proximity correction of the groups in parallel.

According to still another aspect of the invention, a method for verifying mask pattern data for fabricating a circuit includes a first step of dividing original mask pattern data into a first plurality of regions each having a first size; a second step of performing optical proximity correction on each of the first plurality of regions obtained in the first step and creating corrected mask pattern data based on each of the first plurality of regions processed by the optical proximity correction; a third step of dividing the original mask pattern data into a second plurality of regions each having a second size which is different from the first size; a fourth step of performing optical proximity correction on each of the second plurality of regions obtained in the third step and creating mask pattern data for verification based on each of the second plurality of regions processed by the optical proximity correction; a fifth step of comparing the corrected mask pattern data and the mask pattern data for verification and creating comparison result data; a sixth step of determining whether or not a graphic pattern included in the comparison result data created in the fifth step has a size within a prescribed range; and a seventh step of, when it is determined that the graphic pattern has a size within the prescribed range as a result of the comparison performed in the sixth step, determining that the corrected mask pattern data has been properly corrected and setting the corrected mask pattern data as the mask pattern data for fabricating the circuit; and when it is determined that the graphic pattern has a size outside the prescribed range as a result of the comparison performed in the sixth step, determining that the corrected mask pattern data has not been properly corrected and deleting a portion of the graphic pattern which is outside the prescribed range from the corrected mask pattern data so as to create the mask pattern data for fabricating the circuit.

In one embodiment of the invention, the prescribed range is Grid$\times\sqrt{2}$ or more but Grid$\times$2 or less, where Grid is a size defining the minimum unit of the pattern.

In one embodiment of the invention, at least one of the first size and the second size is determined based on an experimentally obtained correlation between the optical proximity correction processing time and the size of the plurality of divided regions, and is a value at which the optical proximity correction processing time is minimum or a value close thereto.

In one embodiment of the invention, the second step includes the step of grouping the first plurality of regions obtained in the first step and performing optical proximity correction of the groups in parallel. The fourth step includes the step of grouping the second plurality of regions obtained in the third step and performing optical proximity correction of the groups in parallel.

According to the present invention, two types of mask pattern data are produced by OPC using different sizes of templates, and the two types of mask pattern data are compared. When no non-matching pattern data is extracted, it is determined that the corrected mask pattern data has been properly corrected.

When non-matching pattern data is extracted, it is determined that the corrected mask pattern data has not been properly corrected. The non-matching pattern data is created by an error of an OPC processing program and should not be created. The pattern data which should not be created is deleted from the corrected mask pattern data so as to create properly corrected mask pattern data.

With the rule-based OPC, the corrected mask pattern is crated in accordance with the pre-set rule. With the model-based OPC, different corrected mask patterns may be created in correspondence with the model obtained by optical simulation. These different corrected mask patterns may be appropriate patterns.

When the model-based OPC is used, two types of mask pattern data are produced by OPC using different sizes of templates, and the two types of mask pattern data are compared. When a graphic pattern included in the comparison data has a size within a prescribed range, it is determined that the corrected mask pattern has been properly corrected. When a graphic pattern included in the comparison data has a size outside a prescribed range, it is determined that the corrected mask pattern has not been properly corrected. The portion of the graphic data which is outside the prescribed range is created by an error of an OPC processing program and should not be created. This portion is deleted from the corrected mask pattern data so as to create properly corrected mask pattern data. In this case, the prescribed range is preferably Grid$\times\sqrt{2}$ or more but Grid$\times$2 or less.

It is preferable to set at least one of the two template sizes to a value at which the OPC processing time is shortest or the vicinity thereof. Thus, the processing time can be shortened. A plurality of templates can be grouped into a plurality of groups, and the plurality of groups are processed in parallel. Thus, the processing time can further be shortened.

Thus, the invention described herein makes possible the advantages of providing a method for creating mask pattern data for fabricating a circuit for creating miniaturized corrected mask pattern data at high precision, and a method for verifying mask pattern data for fabricating a circuit for verifying at high precision that the corrected mask pattern data has been properly corrected.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
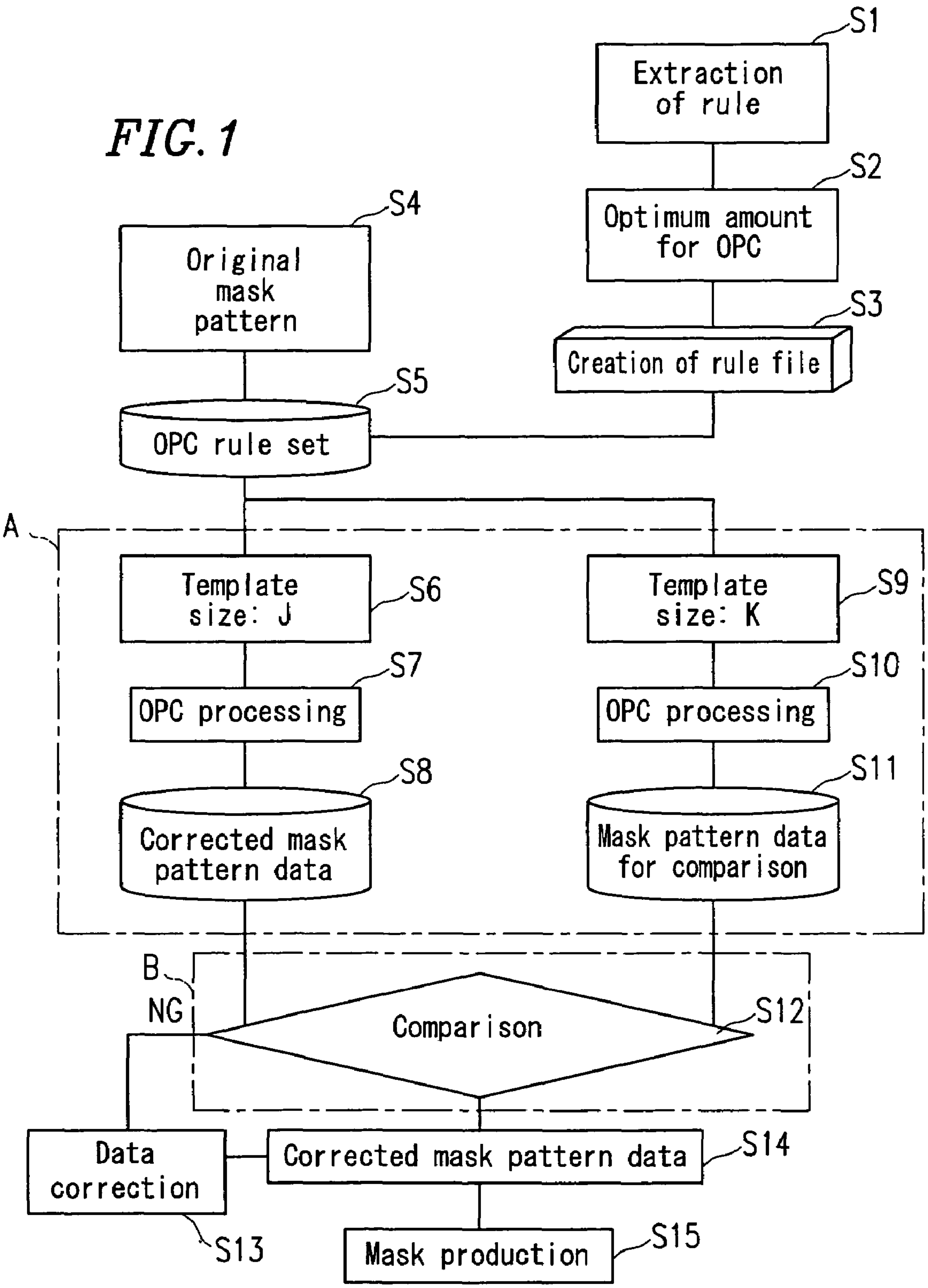
FIG. 1 shows a procedure of a corrected mask pattern data creation method and a corrected mask pattern data verification method according to a first example of the present invention.

FIG. 1 shows a procedure of a method for creating mask pattern data for fabricating a circuit and a method for verifying mask pattern data for fabricating a circuit according to a first example of the present invention. In this example, rule-based OPC is used.

Step S1: A rule is extracted for a mask pattern for a circuit layout which needs to be processed by OPC. After the rule is extracted, the processing goes to step S2. The rule is extracted in detail as follows.

First, a pre-prepared TEG (test element group) mask for characteristic evaluation is transferred onto a wafer by stepper exposure. Based on the transferred mask pattern, a simple change rule, which is required for correcting the mask pattern, is obtained. Then, the obtained change rule is represented as a rule in accordance with a prescribed format. Then, the represented rule is extracted.

Step S2: The optimum correction amount for OPC (maximum bias) is obtained. Then, the processing goes to step S3.

Step S3: A rule file is created based on the extracted rule (step S1) and the optimum correction amount (step S2). Then, the processing goes to step S5.

Step S4: Original mask pattern data is created. The original mask pattern data is mask pattern data for a circuit layout (mask pattern represented by the design data) and needs to be processed by OPC. Then, the processing goes to step S5.

Step S5: An OPC rule set is created based on the rule file (step S3) and the original mask pattern data (step S4). Then, the processing goes to steps S6 and S9.

Step S6: The original mask pattern is divided into a plurality of regions (templates) under the condition that the template size is J. Then, the processing goes to step S7.

Step S7: The plurality of divided regions (templates) are each processed by OPC in accordance with the OPC rule set (step S5). Then, the processing goes to step S8.

Step S8: Corrected mask pattern data is created. Then, the processing goes to step S12.

Step S9: The original mask pattern is divided into a plurality of regions (templates) under the condition that the template size is K. Then, the processing goes to step S10.

Step S10: The plurality of divided regions (templates) are each processed by OPC in accordance with the OPC rule set (step S5). Then, the processing goes to step S11.

Step S11: Mask pattern data for comparison (mask pattern data for verification) is created. Then, the processing goes to step S12.

As described above, the original mask pattern is processed by OPC using different template sizes, so that the corrected mask pattern data and the mask pattern data for comparison are created. The corrected mask pattern data and the mask pattern data for comparison are both created in accordance with the same OPC rule set, which includes the rule file. Unless each of the plurality of divided regions is abnormally processed by OPC as a result of a bug or the like of the OPC processing program, the corrected mask pattern data and the mask pattern data for comparison are exactly the same.

Step S12: The corrected mask pattern data (step S8) and the mask pattern data for comparison (step S11) are subjected to subtraction by graphic operation processing, such that data representing the common graphic pattern is deleted, thus comparing the two types of data.

When the corrected mask pattern data (step S8) and the mask pattern data for comparison (step S11) include non-matching data, it is determined that the corrected mask pattern data (step S8) processed by OPC under the condition that the template size is J has not been properly corrected and the processing goes to step S13.

When the corrected mask pattern data (step S8) and the mask pattern data for comparison (step S11) do not include non-matching data, it is determined that the corrected mask pattern data (step S8) processed by OPC under the condition that the template size is J has been properly corrected. Thus, the processing goes to step S14.

Step S13: The non-matching data is deleted from the corrected mask pattern data, so as to create properly corrected mask pattern data. Then, the processing goes to step S14.

Step S14: The properly corrected mask pattern data is converted into drawing data to be used for producing a mask. Then, the processing goes to step S15.

Step S15: A mask is produced based on the drawing data (step S14).

As described above, the mask pattern data is corrected by rule-based OPC, and whether or not the corrected mask pattern data has been properly corrected is checked. In this manner, a desired corrected mask pattern data usable for fabricating an LSI circuit is produced.

Steps S6 through S8 and steps S9 through S11 (indicated by chain line A in FIG. 1) are performed using a corrected mask pattern data creation tool. The corrected mask pattern data creation tool is, for example, Taurus-OPC commercially available from Avant! Corporation.

Step S12 (indicated by chain line B in FIG. 1) is performed using a comparison tool. The comparison tool is, for example, Dracula commercially available from Cadence Design Systems.

The method for creating mask pattern data for fabricating a circuit and the method for verifying mask pattern data for fabricating a circuit according to the first example will be described in more detail below.

Steps S6 through S11 (indicated by chain line A) will be described in more detail with reference to FIGS. 2A and 2B.

Figure 2A:
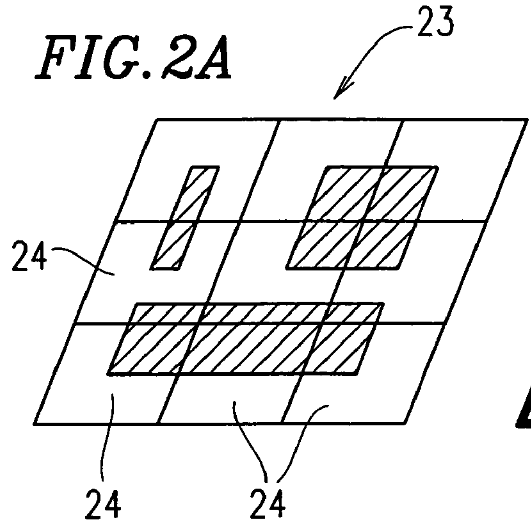
FIG. 2A shows an original mask pattern represented by the design data before being processed by OPC.

FIG. 2A shows an original mask pattern 23 represented by the design data, before being processed by OPC. Reference numeral 24 represents a plurality of templates 24. The original mask pattern 23 is divided into a plurality of regions or templates 24.

Figure 2B:
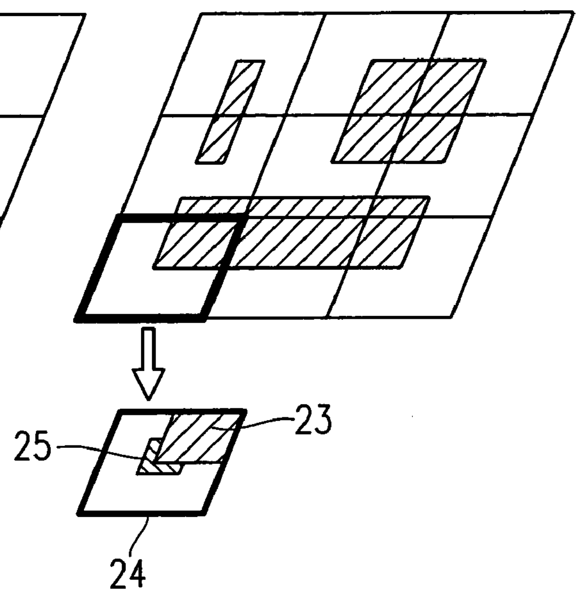
FIG. 2B shows a mask pattern after being processed by OPC.

FIG. 2B shows the original pattern 23 after being processed by OPC. The processing by OPC is performed on each template 24. As a result of OPC, a portion of the original mask pattern 23 in one of the templates 24 (indicated by bold line) is provided with a serif pattern 25.

In this example, the template is set to be a quadrangle, each side of which is about 50,000 nm. Thus, the OPC processing time is shortened. The length of the side of the template is not limited to about 50,000 nm, but can be appropriately set in accordance with the device for which the corrected mask pattern is used.

Figure 3:
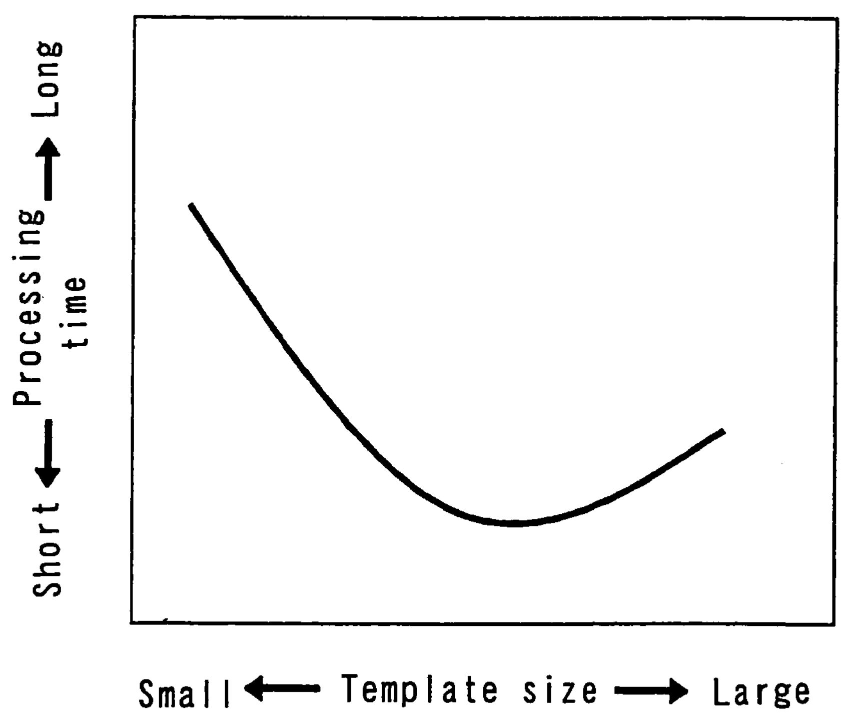
FIG. 3 is a graph qualitatively illustrating the correlation between the template size and the OPC processing time.

FIG. 3 is a graph qualitatively illustrating the correlation between the template size and the OPC processing time required for processing the entire mask pattern corresponding to the entire LSI circuit.

When the template size is set to be smaller than an appropriate size, the amount of data to be processed is increased, and thus the OPC processing time required for processing the entire mask pattern is extended. When the template size is set to be larger than the appropriate size, the OPC processing time required for each of the plurality of templates is extended, and thus again, the OPC processing time required for processing the entire mask pattern is extended.

When the template size is set to be the appropriate size (for example, each side: about 50,000 nm), the OPC processing time is minimized.

As can be appreciated, the OPC processing time relies on the template size. Therefore, the optimum template size is determined based on the process parameters (characteristics) and the mask to be processed. The correlation between the template size and the OPC processing time as shown in FIG. 3 can be obtained experimentally. Thus, the optimum template size, at which the OPC processing time is shortest, can be obtained.

It is preferable to provide an overlap region (for example, having a width of about 1,000 nm) at a border at which a plurality of templates abut on each other. This allows corrected mask pattern data to be created in consideration of the shape of the regions of the original mask pattern in the vicinity of the region to be processed by OPC. As a result, the corrected mask pattern in accordance with the rule or corresponding to the model can be obtained.

In the first example of the present invention, the template having size J is, for example, a square, each side of which is 30,000 nm. The template having size K is, for example, a square, each side of which is 75,000 nm.

When an original mask pattern has mask pattern elements at a low density, it is preferable to set the template size to be relatively large. When an original mask pattern has mask pattern elements at a high density, it is preferable to set the template size to be relatively small. When an original mask pattern has both portions having mask pattern elements at a low density and portions having mask pattern elements at a high density in a mixed state, it is preferable to set the template size to be at an intermediate size between the size set for the original mask pattern having mask pattern elements at a low density and the size set for the original mask pattern having mask pattern elements at a high density.

In this manner, the template size is preferably set in accordance with the density of the mask pattern elements of the original mask pattern. Thus, the OPC processing time can be shortened. This is true regardless of whether rule-based OPC is used or model-based OPC is used.

Step 12 (indicated by chain line B in FIG. 1) will be described in more detail below.

When an OPC processing program includes errors or the like, corrected mask pattern data which should not be created by the corrected mask pattern data creation method is undesirably created. This problem is solved as follows.

A plurality of types of mask pattern data are created by OPC using different template sizes in steps S6 through S11. The corrected mask pattern data (step S8) and the mask pattern data for comparison (step S11) are subjected to subtraction by graphic operation processing, such that data representing the common graphic pattern is deleted. Thus, a pattern which is different between the two types of data is extracted. This pattern can be regarded as having been created due to the error. This non-matching pattern is deleted and thus a corrected mask pattern in accordance with the rule is obtained.

EXAMPLE 2

Figure 4:
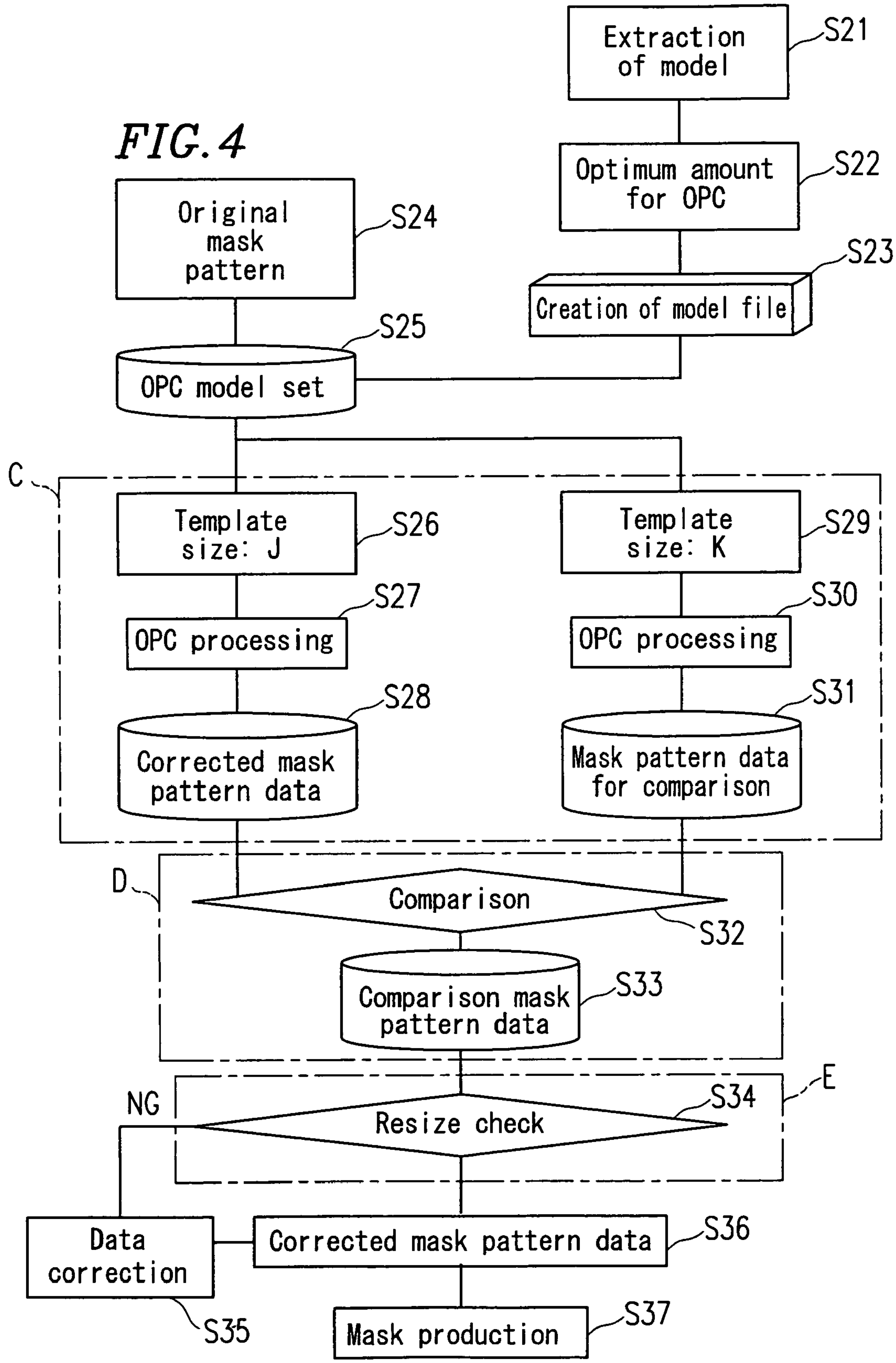
FIG. 4 shows a procedure of a corrected mask pattern data creation method and a corrected mask pattern data verification method according to a second example of the present invention.

FIG. 4 shows a procedure of a method for creating mask pattern data for fabricating a circuit and a method for verifying mask pattern data for fabricating a circuit according to a second example of the present invention. In this example, model-based OPC is used.

Step S21: A model is extracted for a mask pattern for a circuit layout which needs to be processed by OPC. After the model is extracted, the processing goes to step S22. The model is extracted in detail as follows.

First, a pre-prepared TEG (test element group) mask for characteristic evaluation is transferred onto a wafer by stepper exposure. Based on the transferred mask pattern, fundamental photo data is collected.

Step S22: Based on the extracted model, dependency on the line width, dependency on the inter-line width and the like are obtained. Parameters of the optical simulation are adjusted so as to be suitable to the obtained dependency on the line width, dependency on the inter-line width and the like. Using the optical simulation, what pattern will be transferred onto a wafer, what mask will be produced based on the transferred pattern, and the like are checked. The optimum correction amount for OPC is obtained in accordance with the process model (characteristic). Then, the processing goes to step S23.

Step S23: A model file is created based on the extracted model (step S21) and the optimum correction amount (step S22). Then, the processing goes to step S25.

Step S24: Original mask pattern data is created. The original mask pattern data is mask pattern data for a circuit layout (mask pattern represented by the design data) and needs to be processed by OPC. Then, the processing goes to step S25.

Step S25: An OPC model set is created based on the model file (step S23) and the original mask pattern data (step S24). Then, the processing goes to steps S26 and S29.

Step S26: The original mask pattern is divided into a plurality of regions (templates) under the condition that the template size is J. Then, the processing goes to step S27.

Step S27: The plurality of divided regions (templates) are each processed by OPC in accordance with the OPC model set (step S25). Then, the processing goes to step S28.

Step S28: Corrected mask pattern data is created. Then, the processing goes to step S32.

Step S29: The original mask pattern is divided into a plurality of regions (templates) under the condition that the template size is K. Then, the processing goes to step S30.

Step S30: The plurality of divided regions (templates) are each processed by OPC in accordance with the OPC model set (step S25). Then, the processing goes to step S31.

Step S31: Mask pattern data for comparison (mask pattern data for verification) is created. Then, the processing goes to step S32.

As described above, the original mask pattern is processed by OPC using different template sizes, so that the corrected mask pattern data and the mask pattern data for comparison are created.

Step S32: The corrected mask pattern data (step S28) and the mask pattern data for comparison (step S31) are subjected to subtraction by graphic operation processing, such that data representing the common graphic pattern is deleted, thus comparing the two types of data. Then, the processing goes to step S33.

Step S33: Comparison data is created based on the comparison result. The comparison data includes graphic data. Then, the processing goes to step S34.

Step S34: The graphic data is subjected to resize check. When the graphic data has a size outside a prescribed range, it is determined that the corrected mask pattern (step S28) processed by OPC under the condition that the template size is J has not been properly corrected and the processing goes to step S35. When the graphic data has a size within a prescribed range, it is determined that the corrected mask pattern (step S28) processed by OPC under the condition that the template size is J has been properly corrected. Thus, the processing goes to step S36.

Step S35: A portion of the graphic data which is outside the prescribed range is deleted from the corrected mask pattern data, so as to create properly corrected mask pattern data. Then, the processing goes to step S36.

Step S36: The properly corrected mask pattern data is converted into drawing data to be used for producing a mask. Then, the processing goes to step S37.

Step S37: A mask is produced based on the drawing data (step S36).

As described above, the mask pattern data is corrected by model-based OPC, and whether or not the corrected mask pattern data has been properly corrected is checked. In this manner, a desired corrected mask pattern data usable for fabricating an LSI circuit is produced.

Steps S26 through S28 and steps S29 through S31 (indicated by chain line C in FIG. 4) are performed using a corrected mask pattern data creation tool. The corrected mask pattern data creation tool is, for example, Taurus-OPC commercially available from Avant! Corporation.

Steps S32 through S33 (indicated by chain line D in FIG. 4) are performed using a comparison tool. The comparison tool is, for example, Dracula commercially available from Cadence Design Systems.

Steps S26 through S31 (indicated by chain line C) are substantially the same as steps S6 through S11 described above with reference to FIG. 1.

Steps S32 through S33 (indicated by chain line D) will be described in more detail below.

According to the model-based OPC, corrected mask pattern data (step S28) and the comparison data (step S31) are created based on the same OPC model set. Once the OPC model set is described, however, the OPC processing program performs the change of shape, movement of the edges of lines, addition of special patterns, etc. in order to cope with the proximity distortion caused by the difference in template size. Therefore, there is a possibility that a plurality of appropriate corrected mask patterns are created. In other words, when model-based OPC is used, the probability that a plurality of identical mask patterns are created by OPC processing is low. All or some of the created mask patterns may be appropriate mask patterns. This will be explained below with reference to FIGS. 5A through 5D.

Figure 5A:
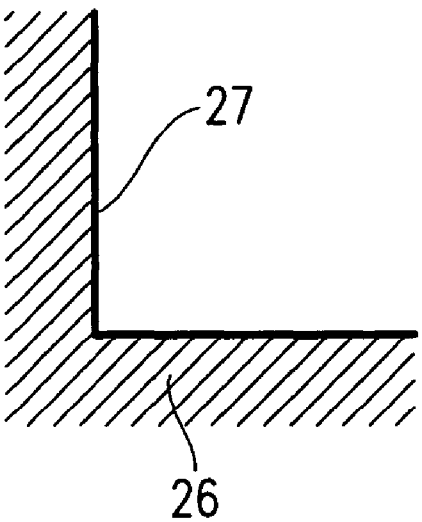
FIGS. 5A through 5D illustrate that a plurality of different appropriate mask patterns may be created with model-based OPC is used.

FIG. 5A shows a pattern 27 obtained by performing ideal transfer (by exposure) of an uncorrected mask pattern 26.

Figure 5B:
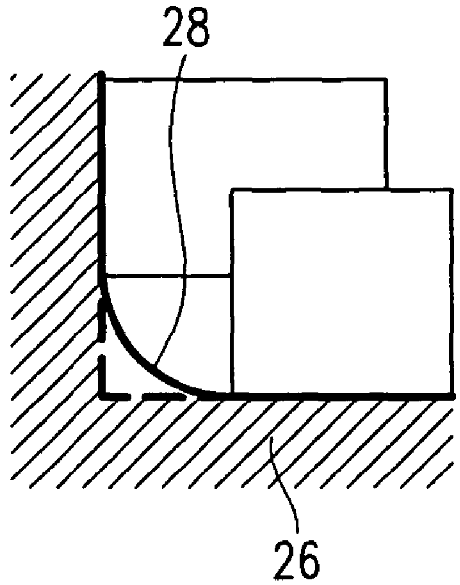

FIG. 5B shows a pattern 28 obtained by performing actual transfer (by exposure) of the uncorrected mask pattern 26. The pattern 28 has a rounded corner and needs to be corrected.

With rule-based OPC, a corrected mask pattern is produced in accordance with the extracted rule. With model-based OPC, a model is first created and the mask pattern is processed by OPC so as to correspond to the created model. Accordingly, with model-based OPC, a corrected mask pattern which is different from the original mask pattern may be created.

Figure 5C:
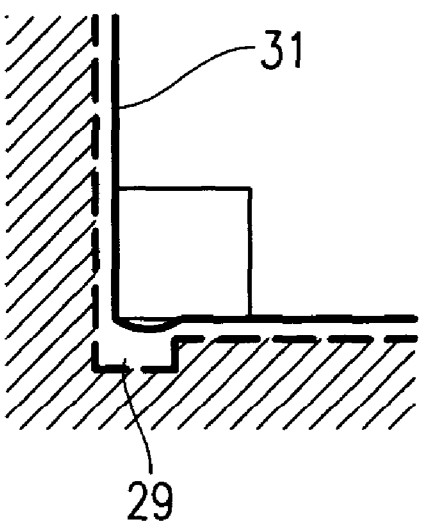

FIG. 5C shows an exemplary pattern 31 obtained by performing actual transfer (by exposure) of a corrected mask pattern 29. The mask pattern 31 is substantially ideal.

Figure 5D:
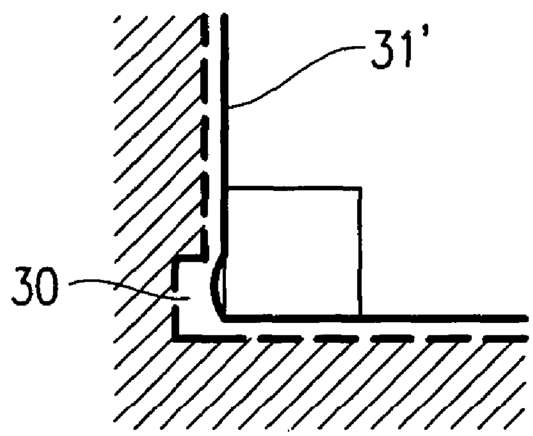

FIG. 5D shows an exemplary pattern 31' obtained by performing actual transfer (by exposure) of a corrected mask pattern 30. The mask pattern 31' is substantially ideal.

When model-based OPC is used, it is necessary to produce comparison data based on the corrected mask pattern data and the mask pattern data for comparison, and perform resize check of the graphic data. Based on the resize check result, it is determined whether or not the corrected mask pattern data has been properly corrected by OPC.

Step S34 (indicated by chain line E in FIG. 4) will be described in detail below.

The corrected mask pattern data and the mask pattern data for comparison include data which is not positioned on a grid. A "grid" is a virtual coordinate which defines the minimum unit of a pattern. In this specification, the distance between two adjacent grids is represented by "1 Grid".

The corrected mask pattern data and the mask pattern data for comparison are output on a grid-by-grid basis. The corrected mask pattern represented by the corrected mask pattern data may have an error of about 1 Grid with respect to the corrected mask pattern represented by the corrected mask pattern data which is output on a grid-by-grid basis.

Such an error, for example, causes the corrected mask pattern 29 (FIG. 5C) and the corrected mask pattern 30 (FIG. 5D) to be created from the same original mask pattern data.

When the error is merely about 1 Grid, it is not necessary to detect the error by resize check. With such a small error, no harmful difference is generated between (i) the mask pattern transferred through the corrected mask pattern represented by the corrected mask pattern data which is output on a grid-by-grid basis and (ii) a desired mask pattern.

When the error is larger than about 1 Grid, it is necessary to detect the error by resize check. In this case, a harmful difference is generated between (i) the mask pattern transferred through the corrected mask pattern represented by the corrected mask pattern data which is output on a grid-by-grid basis and (ii) a desired mask pattern.

Figure 6:
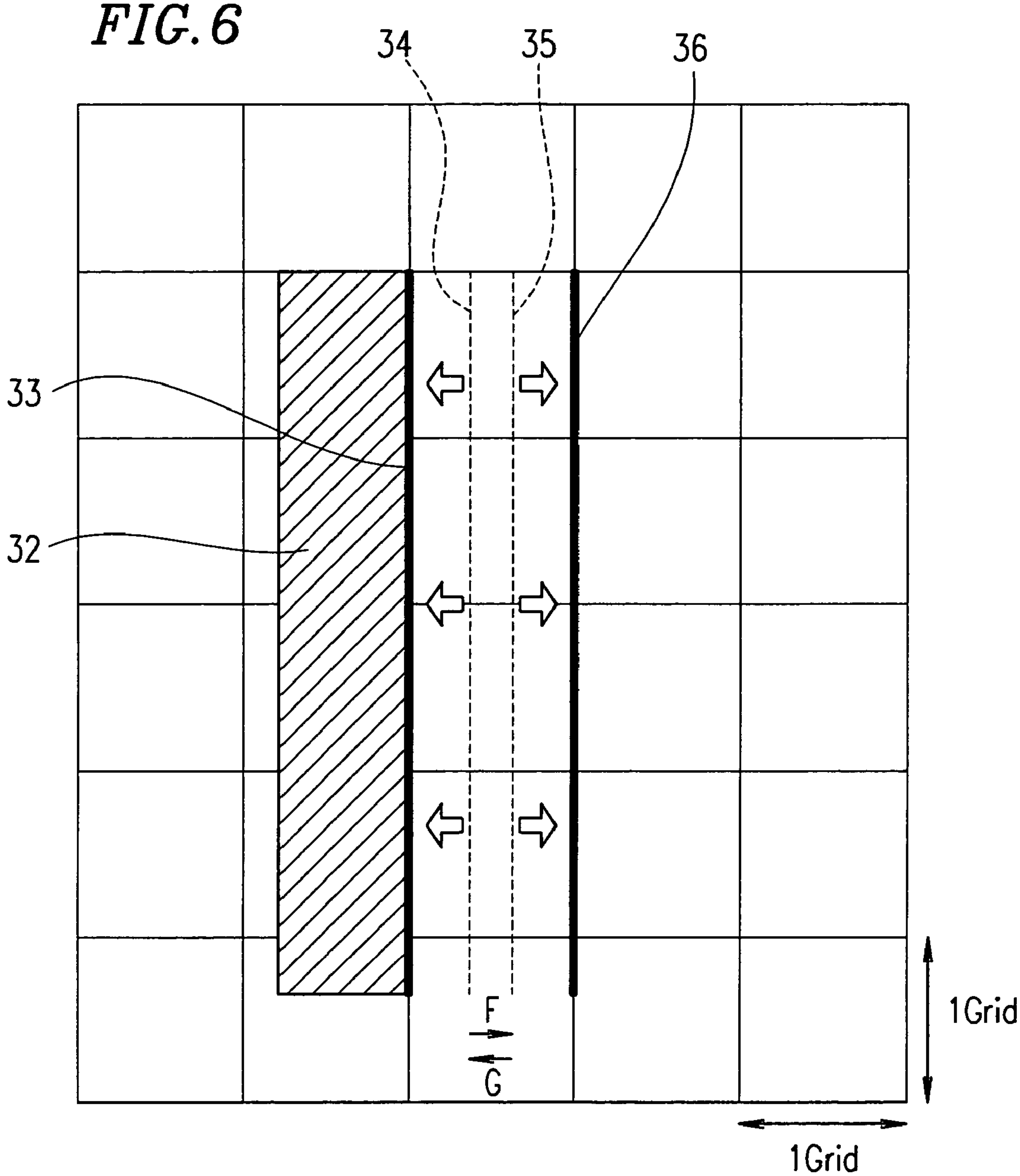
FIG. 6 shows a coordinate system for illustrating an exemplary manner of resize check.
Figure 7:
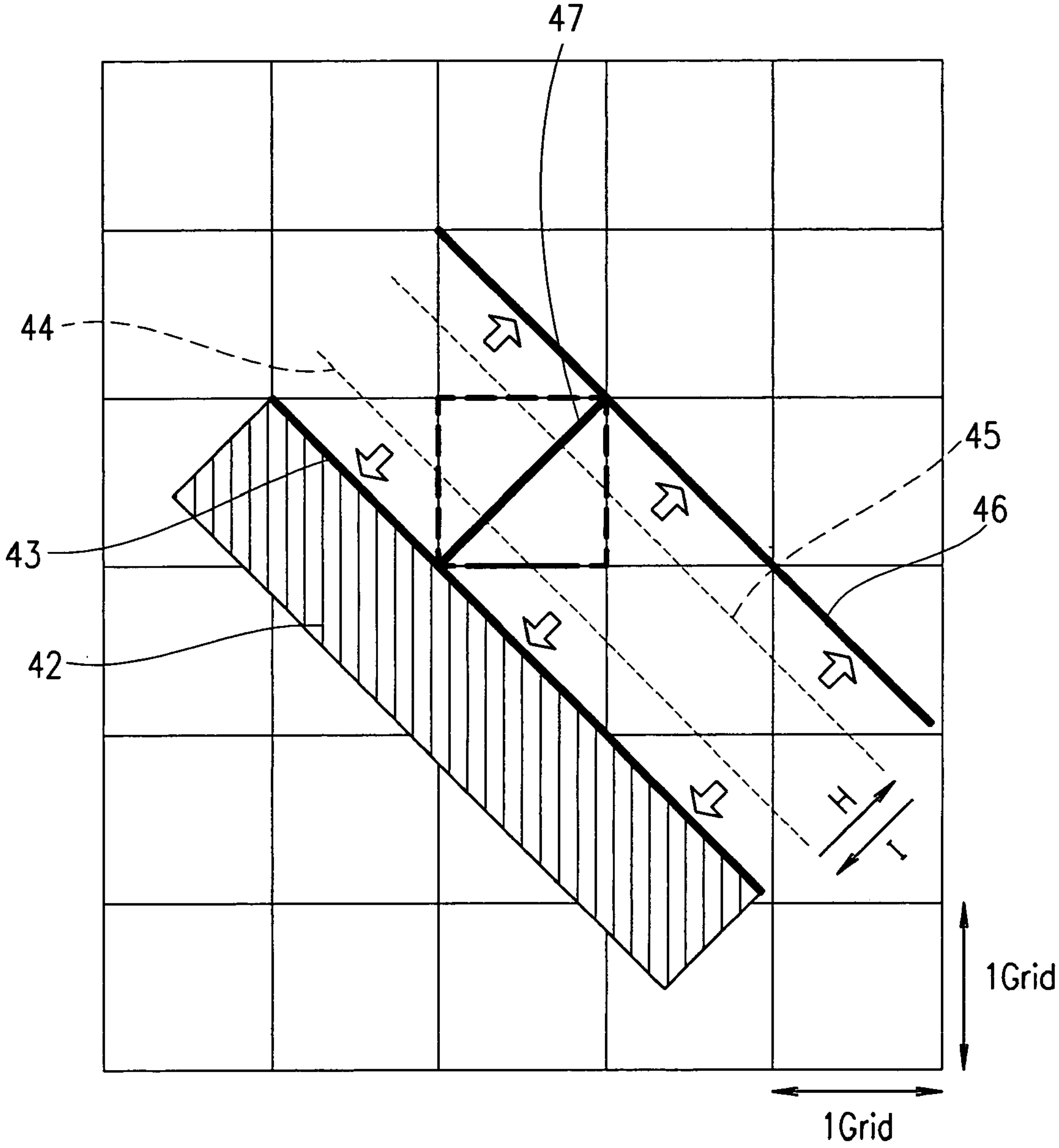
FIG. 7 shows a coordinate system for illustrating an exemplary manner of resize check.
Figure 8:
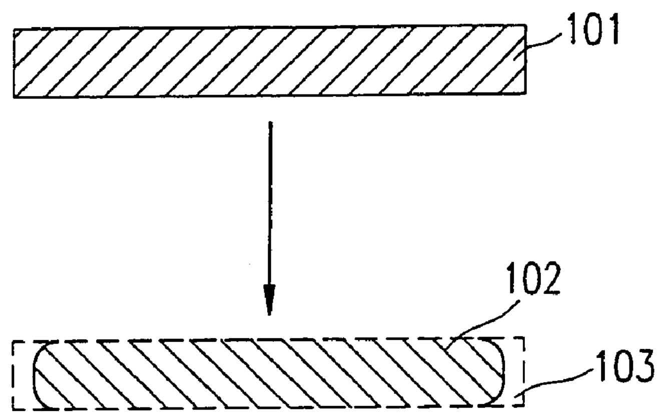
FIG. 8 shows an example of a mask pattern to be exposed and a mask pattern transferred onto a wafer.
Figure 9:
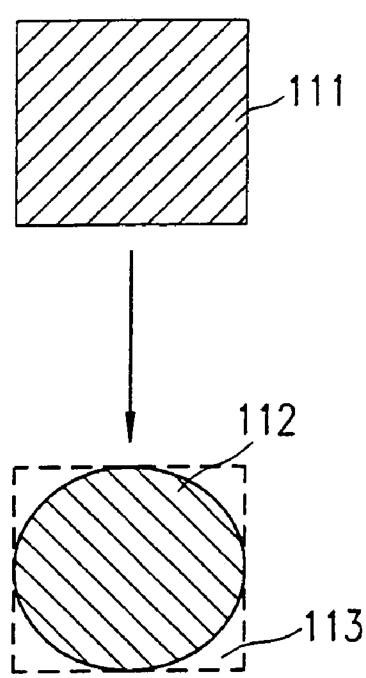
FIG. 9 shows another example of a mask pattern to be exposed and a mask pattern transferred onto a wafer.
Figure 10:
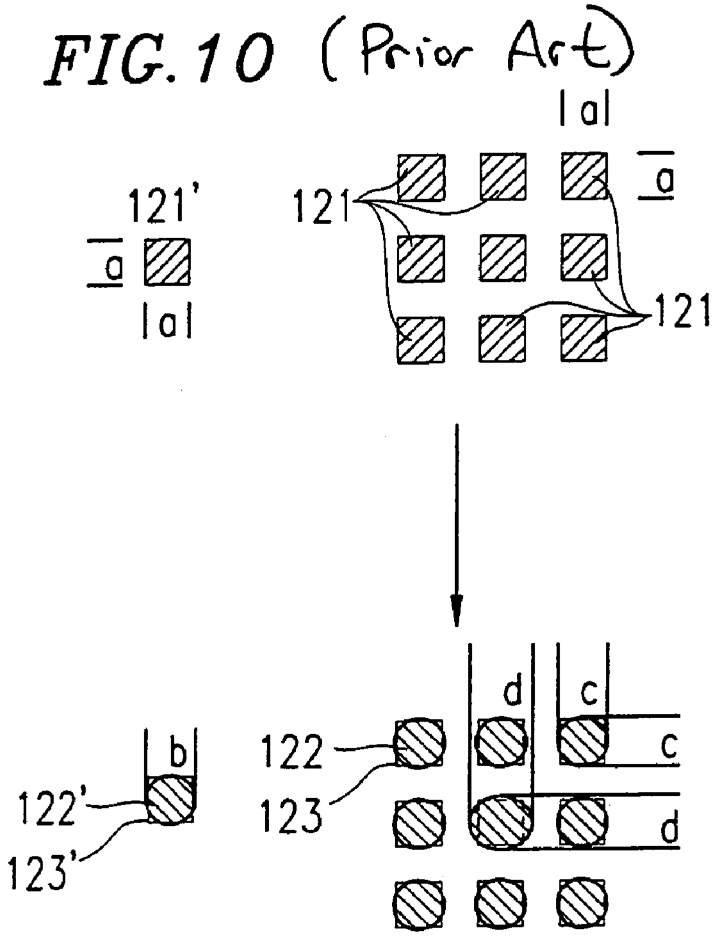
FIG. 10 shows still another example of a mask pattern to be exposed and a mask pattern transferred onto a wafer.
Figure 11:
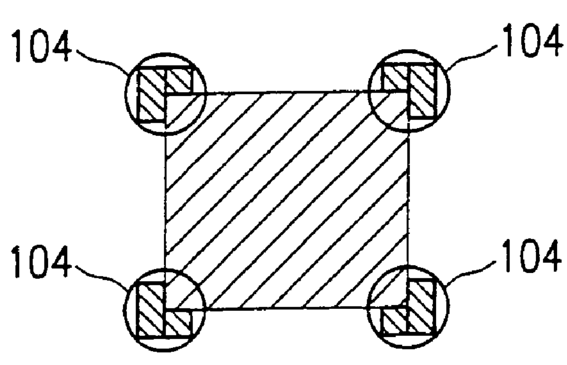
FIG. 11 shows an example of a mask pattern corrected by OPC.
Figure 12:
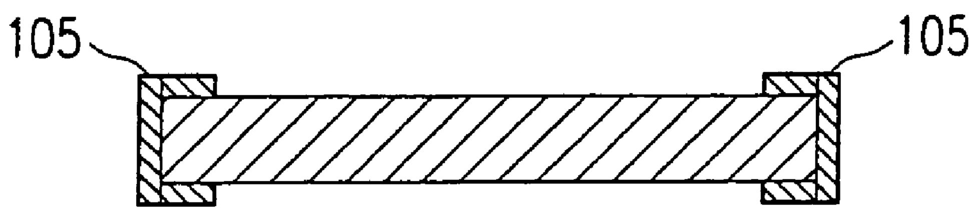
FIG. 12 shows another example of a mask pattern corrected by OPC.
Figure 13:
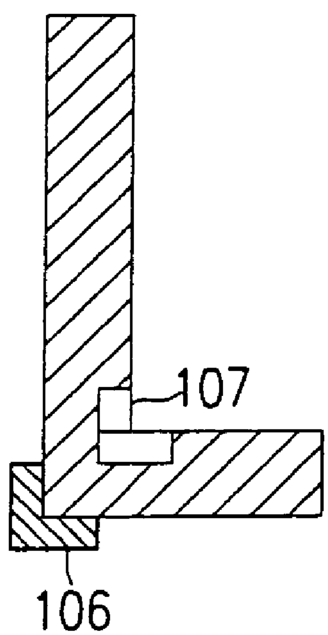
FIG. 13 shows still another example of a mask pattern corrected by OPC.
Figure 14:
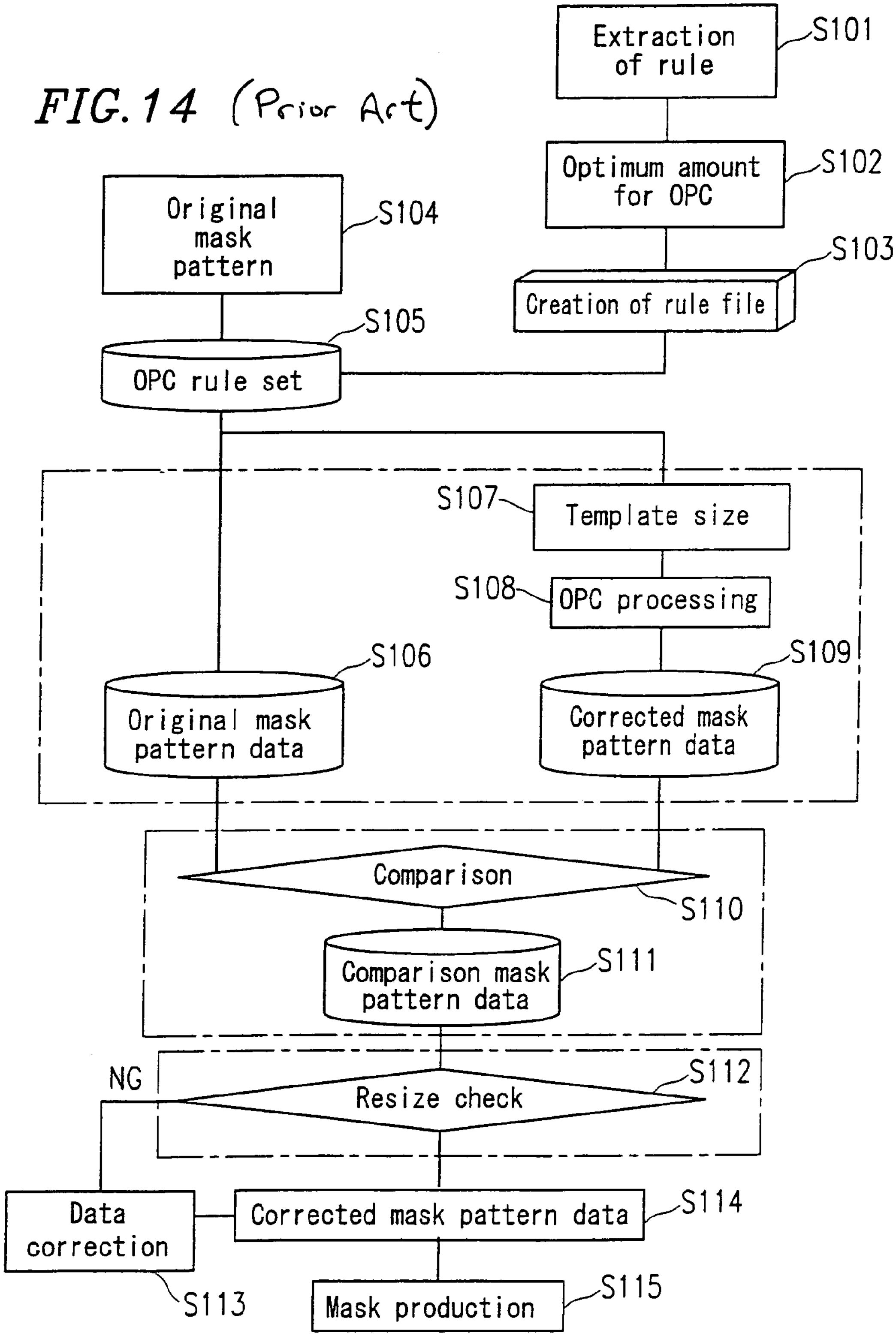
FIG. 14 shows a procedure of a conventional corrected mask pattern verification method.

With reference to FIGS. 6 and 7, the resize check will be described in detail.

FIG. 6 shows a coordinate system represented by grids for illustrating an exemplary manner of resize check. A conductive line mask pattern 32, which is an original mask pattern, includes a line edge 33, which is perpendicular to one of the coordinate axes of the coordinate system. A corrected line edge 34 and a corrected line edge 35 are included in a corrected mask pattern represented by corrected mask pattern data.

When the conductive line mask pattern 32 is divided into a plurality of templates under the condition that the template size is J, the plurality of templates are processed by OPC so as to create corrected mask pattern data. This OPC corrects the data representing line edge 33 into data representing the corrected line edge 34. The corrected line edge 34 is located at a position translated from the position of the line edge 33 in the direction represented by arrow F.

The corrected line edge 34 is not in contact with any grid. However, the corrected mask pattern data is adjusted on a grid-by-grid basis. As a result, the position of the corrected line edge 34 is returned to the position of the line edge 33 (moved in the direction represented by arrow G).

When the conductive line mask pattern 32 is divided into a plurality of templates under the condition that the template size is K, the plurality of templates are processed by OPC so as to create corrected mask pattern data. This OPC corrects the data representing line edge 33 into data representing the corrected line edge 35. The corrected line edge 35 is located at a position translated from the position of the line edge 33 in the direction represented by arrow F.

The corrected line edge 35 is not in contact with any grid. However, the corrected mask pattern data is adjusted on a grid-by-grid basis. As a result, the position of the corrected line edge 35 is moved to the position of a line edge 36 (moved in the direction represented by arrow F). The position of the corrected line edge 36 is located at a position translated from the position of the line edge 33 in the direction represented by arrow F by 1 Grid.

FIG. 7 shows a coordinate system represented by grids for illustrating another exemplary manner of resize check. A conductive line mask pattern 42, which is an original mask pattern, includes a line edge 43 which is oblique with respect to the coordinate axes of the coordinate system. A corrected line edge 44 and a corrected line edge 45 are included in a corrected mask pattern represented by corrected mask pattern data.

When the conductive line mask pattern 42 is divided into a plurality of templates under the condition that the template size is J, the plurality of templates are processed by OPC so as to create corrected mask pattern data. This OPC corrects the data representing line edge 43 into data representing the corrected line edge 44. The corrected line edge 44 is located at a position translated from the position of the line edge 43 in the direction represented by arrow H.

The corrected line edge 44 is not in contact with any grid. However, the corrected mask pattern data is adjusted on a grid-by-grid basis. As a result, the position of the corrected line edge 44 is returned to the position of the line edge 43 (moved in the direction represented by arrow I).

When the conductive line mask pattern 42 is divided into a plurality of templates under the condition that the template size is K, the plurality of templates are processed by OPC so as to create corrected mask pattern data. This OPC corrects the data representing line edge 43 into data representing the corrected line edge 45. The corrected line edge 45 is located at a position translated from the position of the line edge 43 in the direction represented by arrow H.

The corrected line edge 45 is not in contact with any grid. However, the corrected mask pattern data is adjusted on a grid-by-grid basis. As a result, the position of the corrected line edge 45 is moved to the position of a line edge 46 (moved in the direction represented by arrow H). The position of the corrected line edge 46 is located at a position translated from the position of the line edge 43 in the direction represented by arrow H by grid×$\sqrt{2}$ (represented by line 47 in FIG. 7).

As described above, the minimum resize amount is preferably Grid×$\sqrt{2}$ (which is the moving distance of the oblique pattern when it is corrected by translation in a direction oblique to the axes of the coordinate system). The maximum resize amount is preferably less than Grid×2. (Grid×2 is the minimum value over which a harmful difference is generated between a pre-transfer shape and a post-transfer shape of the pattern.) The minimum resize amount is the lower limit of a prescribed range which is the criterion to determine whether or not the corrected mask pattern obtained by OPC has been properly corrected. The maximum resize amount is the upper limit of such a prescribed range.

The "Grid" in "1 Grid", "Grid×2" and "Grid×$\sqrt{2}$" is the length of each side of each grid (the size defining the minimum unit of a pattern), and is pre-set.

The resize check is performed by subtracting the resize amount from the graphic data. The resize amount is grid×$\sqrt{2}$ or more but grid×2 or less.

When the graphic data does not become zero as a result of resize check, it is determined that the corrected mask pattern has not been properly corrected. In this case, the mask pattern is further corrected to create a properly corrected mask pattern as described above. When the graphic data becomes zero as a result of resize check, it is determined that the corrected mask pattern has been properly corrected.

Thus, the mask pattern data corrected by OPC corresponding to the model is created as corrected mask pattern data.

The OPC processing described in the first and second examples is performed on a template-by-template basis. Since mask pattern elements of an original mask pattern locally included in a plurality of templates are processed, the plurality of templates, even though being processed simultaneously, are not processed in a mutually dependent manner. The plurality of templates may be grouped into a plurality of groups, so that the groups are processed in parallel by a plurality of OPC processing devices.

In this case, the processing time is shortened in accordance with the number of groups and the number of devices used. Especially because the OPC processing for creating corrected mask pattern data and the OPC processing for creating mask pattern data for comparison are performed according to the present invention, the processing time is significantly shortened.

According to the present invention, the optimum verification method is used for pattern data which is processed by OPC, and thus a highly reliable mask matching the layout design can be produced. The proximity distortion is avoided. The OPC masks can be produced in a larger quantity at a higher efficiency. Production of semiconductor integrated circuits using a mask produced according to the present invention prevents electrical disadvantages and increases the production yield of the semiconductor integrated circuits.

A plurality of templates may be grouped into a plurality of groups and the groups may be processed by a plurality of devices in parallel. In this case, a series of processing from optical proximity correction to verification can be performed in one flow, and thus at high speed and at a high efficiency. Such a parallel operation is advantageous for the present invention, by which OPC processing is performed a plurality of times. Thus, the OPC masks can be produced at a larger quantity at a higher efficiency. This allows desired patterns to be transferred onto wafers at a higher precision, which remarkably improves the production yield of the semiconductor integrated circuits.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for creating mask pattern data for fabricating a circuit, comprising:

a first step of dividing original mask pattern data into a first plurality of regions each having a first size;

a second step of performing optical proximity correction on each of the first plurality of regions obtained in the first step and creating first mask pattern data based on each of the first plurality of regions processed by the optical proximity correction;

a third step of dividing the original mask pattern data into a second plurality of regions each having a second size which is different from the first size;

a fourth step of performing optical proximity correction on each of the second plurality of regions obtained in the third step and creating second mask pattern data based on each of the second plurality of regions processed by the optical proximity correction;

a fifth step of comparing the first mask pattern data and the second mask pattern data; and a sixth step of, when it is determined that there is no non-matching data representing a non-matching portion between the first mask pattern data and the second mask pattern data as a result of the comparison performed in the fifth step, setting the first mask pattern data or the second mask pattern data as the mask pattern data for fabricating the circuit; and when it is determined that there is non-matching data, deleting the non-matching data from the first mask pattern data or the second mask pattern data so as to create the mask pattern data for fabricating the circuit.

2. A method according to claim 1, wherein at least one of the first size and the second size is determined based on an experimentally obtained correlation between the optical proximity correction processing time and the size of the plurality of divided regions, and is a value at which the optical proximity correction processing time is minimum or a value close thereto.

3. A method according to claim 1, wherein:

the second step includes the step of grouping the first plurality of regions obtained in the first step and performing optical proximity correction of the groups in parallel, and the fourth step includes the step of grouping the second plurality of regions obtained in the third step and performing optical proximity correction of the groups in parallel.

4. The method according to claim 1, wherein the second step of performing optical proximity correction (OPC) and the fourth step of performing OPC are implemented using the same OPC set.

5. A method for creating mask pattern data for fabricating a circuit, comprising:

a first step of dividing original mask pattern data into a first plurality of regions each having a first size;

a second step of performing optical proximity correction on each of the first plurality of regions obtained in the first step and creating first mask pattern data based on each of the first plurality of regions processed by the optical proximity correction;

a third step of dividing the original mask pattern data into a second plurality of regions each having a second size which is different from the first size;

a fourth step of performing optical proximity correction on each of the second plurality of regions obtained in the third step and creating second mask pattern data based on each of the second plurality of regions processed by the optical proximity correction;

a fifth step of comparing the first mask pattern data and the second mask pattern data and creating comparison result data; and a sixth step of determining whether or not a graphic pattern included in the comparison result data created in the fifth step has a size within a prescribed range; and a seventh step of, when it is determined that the graphic pattern has a size within the prescribed range as a result of the comparison performed in the sixth step, setting the first mask pattern data or the second mask pattern data as the mask pattern data for fabricating the circuit; and when it is determined that the graphic pattern has a size outside the prescribed range as a result of the comparison performed in the sixth step, deleting a portion of the graphic pattern which is outside the prescribed range from the first mask pattern data or the second mask pattern data so as to create the mask pattern data for fabricating the circuit.

6. A method according to claim 5, wherein the prescribed range is Grid$\times\sqrt{2}$ or more but Grid$\times$2 or less, where Grid is a size defining the minimum unit of the pattern.

7. A method according to claim 5, wherein at least one of the first size and the second size is determined based on an experimentally obtained correlation between the optical proximity correction processing time and the size of the plurality of divided regions, and is a value at which the optical proximity correction processing time is minimum or a value close thereto.

8. A method according to claim 5, wherein:

the second step includes the step of grouping the first plurality of regions obtained in the first step and performing optical proximity correction of the groups in parallel, and the fourth step includes the step of grouping the second plurality of regions obtained in the third step and performing optical proximity correction of the groups in parallel.

9. The method according to claim 5, wherein the second step of performing optical proximity correction (OPC) and the fourth step of performing OPC are implemented using the same OPC set.

10. A method for verifying mask pattern data for fabricating a circuit, comprising:

a first step of dividing original mask pattern data into a first plurality of regions each having a first size;

a second step of performing optical proximity correction on each of the first plurality of regions obtained in the first step and creating corrected mask pattern data based on each of the first plurality of regions processed by the optical proximity correction;

a third step of dividing the original mask pattern data into a second plurality of regions each having a second size which is different from the first size;

a fourth step of performing optical proximity correction on each of the second plurality of regions obtained in the third step and creating mask pattern data for verification based on each of the second plurality of regions processed by the optical proximity correction;

a fifth step of comparing the corrected mask pattern data and the mask pattern data for verification; and a sixth step of, when it is determined that there is no non-matching data representing a non-matching portion between the corrected mask pattern data and the mask pattern data for verification as a result of the comparison performed in the fifth step, determining that the corrected mask pattern data has been properly corrected and setting the corrected mask pattern data as the mask pattern data for fabricating the circuit; and when it is determined that there is non-matching data, determining that the corrected mask pattern data has not been properly corrected and deleting the non-matching data from the corrected mask pattern data so as to create the mask pattern data for fabricating the circuit.

11. A method according to claim 10, wherein at least one of the first size and the second size is determined based on an experimentally obtained correlation between the optical proximity correction processing time and the size of the plurality of divided regions, and is a value at which the optical proximity correction processing time is minimum or a value close thereto.

12. A method according to claim 10, wherein:

the second step includes the step of grouping the first plurality of regions obtained in the first step and performing optical proximity correction of the groups in parallel, and the fourth step includes the step of grouping the second plurality of regions obtained in the third step and performing optical proximity correction of the groups in parallel.

13. The method according to claim 10, wherein the second step of performing optical proximity correction (OPC) and the fourth step of performing OPC are implemented using the same OPC set.

14. A method for verifying mask pattern data for fabricating a circuit, comprising:

a first step of dividing original mask pattern data into a first plurality of regions each having a first size;

a second step of performing optical proximity correction on each of the first plurality of regions obtained in the first step and creating corrected mask pattern data based on each of the first plurality of regions processed by the optical proximity correction;

a third step of dividing the original mask pattern data into a second plurality of regions each having a second size which is different from the first size;

a fourth step of performing optical proximity correction on each of the second plurality of regions obtained in the third step and creating mask pattern data for verification based on each of the second plurality of regions processed by the optical proximity correction;

a fifth step of comparing the corrected mask pattern data and the mask pattern data for verification and creating comparison result data; and a sixth step of determining whether or not a graphic pattern included in the comparison result data created in the fifth step has a size within a prescribed range; and a seventh step of, when it is determined that the graphic pattern has a size within the prescribed range as a result of the comparison performed in the sixth step, determining that the corrected mask pattern data has been properly corrected and setting the corrected mask pattern data as the mask pattern data for fabricating the circuit; and when it is determined that the graphic pattern has a size outside the prescribed range as a result of the comparison performed in the sixth step, determining that the corrected mask pattern data has not been properly corrected and deleting a portion of the graphic pattern which is outside the prescribed range from the corrected mask pattern data so as to create the mask pattern data for fabricating the circuit.

15. A method according to claim 14, wherein the prescribed range is Grid×$\sqrt{2}$ or more but Grid×2 or less, where Grid is a size defining the minimum unit of the pattern.

16. A method according to claim 14, wherein at least one of the first size and the second size is determined based on an experimentally obtained correlation between the optical proximity correction processing time and the size of the plurality of divided regions, and is a value at which the optical proximity correction processing time is minimum or a value close thereto.

17. A method according to claim 14, wherein:

the second step includes the step of grouping the first plurality of regions obtained in the first step and performing optical proximity correction of the groups in parallel, and the fourth step includes the step of grouping the second plurality of regions obtained in the third step and performing optical proximity correction of the groups in parallel.

18. The method according to claim 1, wherein the second step of performing optical proximity correction (OPC) and the fourth step of performing OPC are implemented using the same OPC set.

* * * * *